United States Patent
Matsuda et al.

(10) Patent No.: US 9,354,593 B2
(45) Date of Patent: May 31, 2016

(54) CABINET STRUCTURE, ELECTRONIC EQUIPMENT, AND IMAGE FORMING APPARATUS

(71) Applicants: Naoki Matsuda, Kanagawa (JP); Masahiro Ishida, Kanagawa (JP)

(72) Inventors: Naoki Matsuda, Kanagawa (JP); Masahiro Ishida, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 0 days.

(21) Appl. No.: 14/630,877

(22) Filed: Feb. 25, 2015

(65) Prior Publication Data
US 2015/0248880 A1 Sep. 3, 2015

(30) Foreign Application Priority Data
Mar. 3, 2014 (JP) ................................ 2014-040450

(51) Int. Cl.
G03G 15/00 (2006.01)
G03G 21/00 (2006.01)
G03G 21/16 (2006.01)
G03G 21/20 (2006.01)
G10K 11/16 (2006.01)

(52) U.S. Cl.
CPC .......... G03G 21/1619 (2013.01); G03G 21/206 (2013.01); G10K 11/16 (2013.01)

(58) Field of Classification Search
CPC ... G03G 15/00; G03G 21/1619; G03G 21/20; G03G 21/206; G03G 2221/1645; G10K 15/04
USPC .............................................. 399/107, 92, 94
See application file for complete search history.

(56) References Cited

U.S. PATENT DOCUMENTS

| 5,623,178 | A | 4/1997 | Kawabata et al. |
| 6,584,299 | B2 * | 6/2003 | Nomura ............. G03G 15/6552 399/92 X |
| 7,036,251 | B2 | 5/2006 | Kojima et al. |
| 2007/0059019 | A1 * | 3/2007 | Kasama ............. G03G 15/6573 399/91 |

FOREIGN PATENT DOCUMENTS

| JP | 07-039097 | 2/1995 |
| JP | 2004-293183 | 10/2004 |
| JP | 2006-293221 | 10/2006 |
| JP | 2010-097036 | 4/2010 |

OTHER PUBLICATIONS

Machine translation of JP 2010-097036 (published on Apr. 30, 2010) printed on Aug. 21, 2015.*

* cited by examiner

*Primary Examiner* — Sophia S Chen
(74) *Attorney, Agent, or Firm* — Harness, Dickey & Pierce, P.L.C.

(57) ABSTRACT

A cabinet structure includes multiple cover members configured to spatially partition an inside from an outside of a cabinet, and a clearance communicating between the inside and the outside of the cabinet is left between two cover members, the two cover members being adjacent to each other, of the cover members, and a passage defined by the clearance and leading from the inside to the outside of the cabinet through the clearance has a shape with multiple bends.

17 Claims, 12 Drawing Sheets

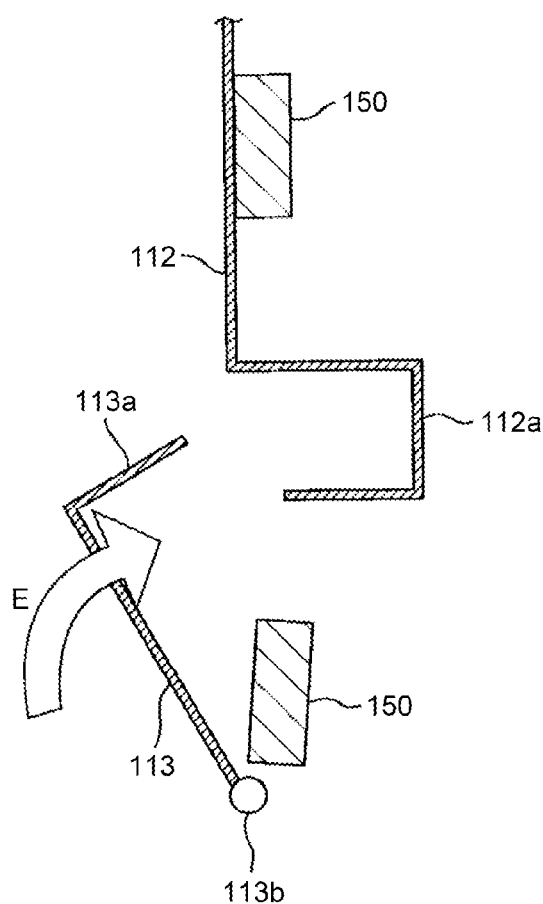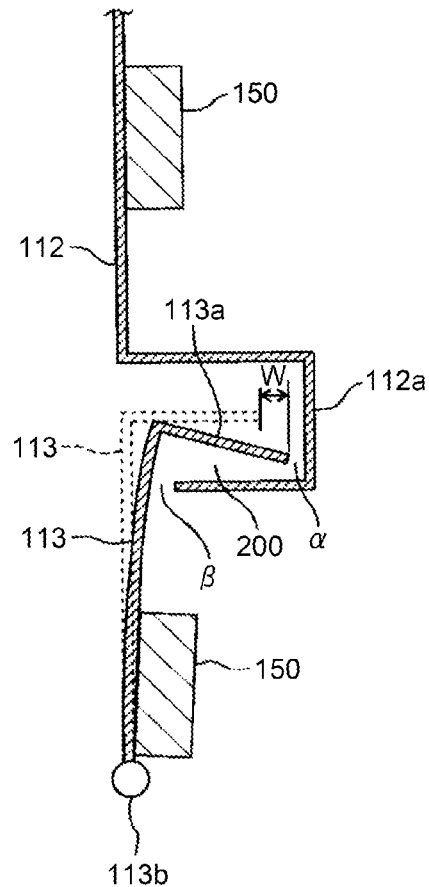

FIG.10A
FIG.10B
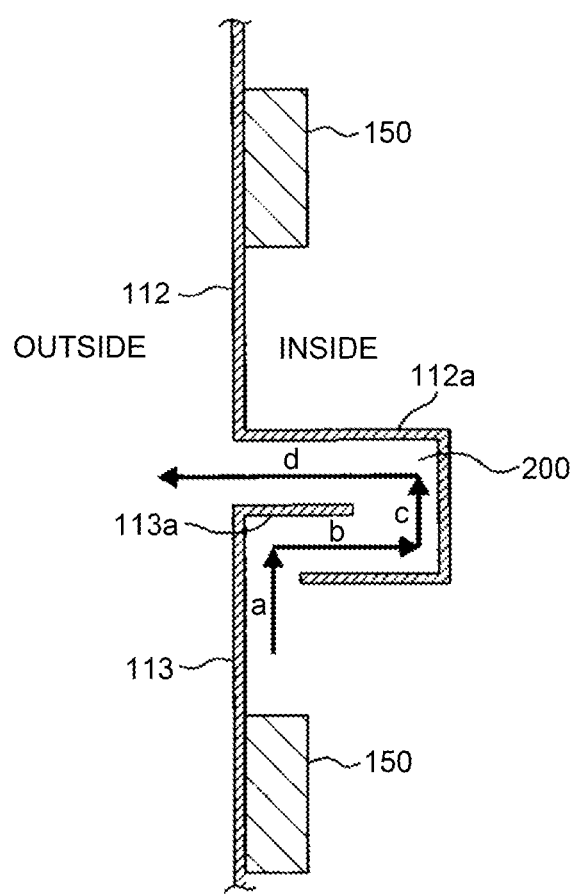
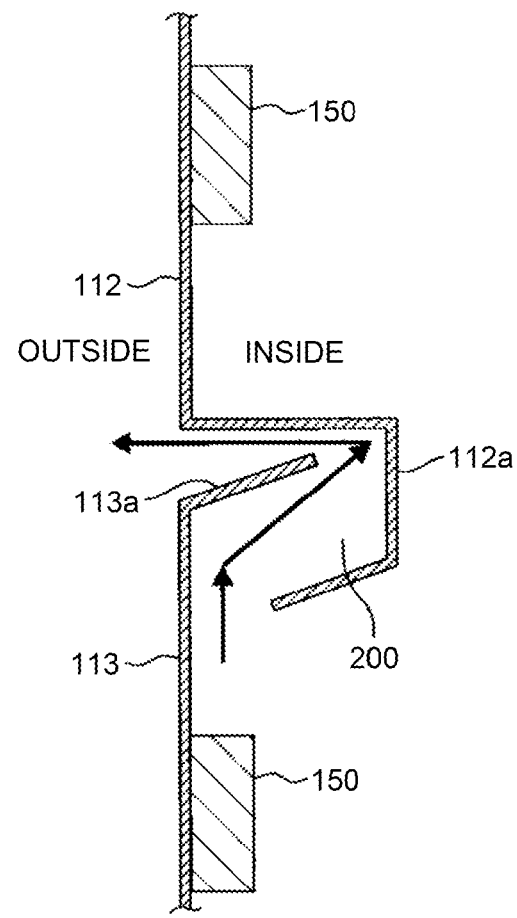

CABINET STRUCTURE, ELECTRONIC EQUIPMENT, AND IMAGE FORMING APPARATUS

CROSS-REFERENCE TO RELATED APPLICATIONS

The present application claims priority to and incorporates by reference the entire contents of Japanese Patent Application No. 2014-040450 filed in Japan on Mar. 3, 2014.

BACKGROUND OF THE INVENTION

1. Field of the Invention

The present invention relates generally to a cabinet structure including cover members configured to spatially partition an interior space from an exterior space of a cabinet, and an electronic equipment and an image forming apparatus each including the cabinet structure.

2. Description of the Related Art

An electro-photographic image forming apparatus generally includes an exterior cover for covering various devices involved in image forming processes arranged in a cabinet and for spatially separating inside from outside of the cabinet. Examples of such an exterior cover are disclosed in Japanese Laid-open Utility Model Application H7-39097 and Japanese Laid-open Patent Application No. 2006-293221. Some type of an exterior cover which forms side surfaces of an image forming apparatus is configured to cover a single side surface with multiple exterior-cover pieces in a manner that each exterior-cover piece covers one of regions into which the side surface is divided. In one exemplary structure configuration of such an exterior cover which covers a single side surface with multiple exterior-cover pieces, a region of the apparatus where electrical components are contained and a region where a drive device is contained are covered with different exterior-cover pieces. The structure configuration in which a single side surface is covered with multiple exterior-cover pieces advantageously reduces the size of exterior-cover piece to be removed by a maintenance person in a maintenance or checkout operation as compared with a structure configuration in which the single side surface is covered with a single large exterior cover, thereby facilitating operations.

Meanwhile, an image forming apparatus emits sounds such as operating sounds of various drive units and rotational sound of a rotating polygon mirror. If transmitted to the outside of the apparatus, such sounds can be noise uncomfortable to people near the apparatus. Such an exterior cover as that described above can reduce transmission of these sounds, which can be noise, from the inside to the outside of the apparatus, thereby reducing noise emission.

However, if there is a clearance between adjacent exterior-cover pieces of the multiple exterior-cover pieces, sounds emitted inside the apparatus can leak to the outside through the clearance and can be noise. A technology which can solve this problem is disclosed in Japanese Laid-open Utility Model Application H7-39097. In a structure configuration according to this technique, adjacent exterior-cover pieces are partially overlapped in contact with each other so that a clearance through which sounds can leak is not left.

However, the various drive units of the image forming apparatus not only emit sounds but also generate heat in their operation. The structure configuration described above in which adjacent exterior-cover pieces are partially overlapped in contact with each other is disadvantageous in that not only sounds but also air flow are reduced by the elimination of the clearance, which leads to an undesirable temperature rise inside the cabinet.

This problem is not limited to image forming apparatuses but can arise in any cabinet structure including multiple cover members which spatially partition inside from outside of the cabinet.

Under the circumstances, there is a need for a cabinet structure including multiple cover members and capable of reducing sound leakage while reducing a temperature rise inside the cabinet, and an electronic equipment and an image forming apparatus each including the cabinet structure.

It is an object of the present invention to at least partially solve the problems in the conventional technology.

SUMMARY OF THE INVENTION

It is an object of the present invention to at least partially solve the problems in the conventional technology.

There is provided a cabinet structure that includes multiple cover members configured to spatially partition an inside from an outside of a cabinet, and a clearance communicating between the inside and the outside of the cabinet is left between two cover members, the two cover members being adjacent to each other, of the cover members, and a passage defined by the clearance and leading from the inside to the outside of the cabinet through the clearance has a shape with multiple bends.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 5A and 5B are explanatory diagrams of a structure configuration in which the third left-side cover is configured as a hinged cover member operable to open and close, with FIG. 5A being an explanatory diagram of a state where the third left-side cover is being closed, FIG. 5B being an explanatory diagram of a state immediately after the third left-side cover is closed with a force greater than necessary;

FIGS. 10A and 10B are top views of a structure configuration with three bends, schematically illustrating the projecting cover section and a projecting-cover-section accommodating section that are deformed, with FIG. 10A being an explanatory diagram of pre-deformation, FIG. 10B being an explanatory diagram of post-deformation.

DETAILED DESCRIPTION OF THE PREFERRED EMBODIMENTS

Exemplary embodiments of the present invention are described below. In an embodiment, an image forming apparatus according to an aspect of the present invention is implemented as an electro-photographic printer (hereinafter, simply referred to as the "printer 100").

A basic configuration of the printer 100 according to the embodiment is described below.

Figure 2:
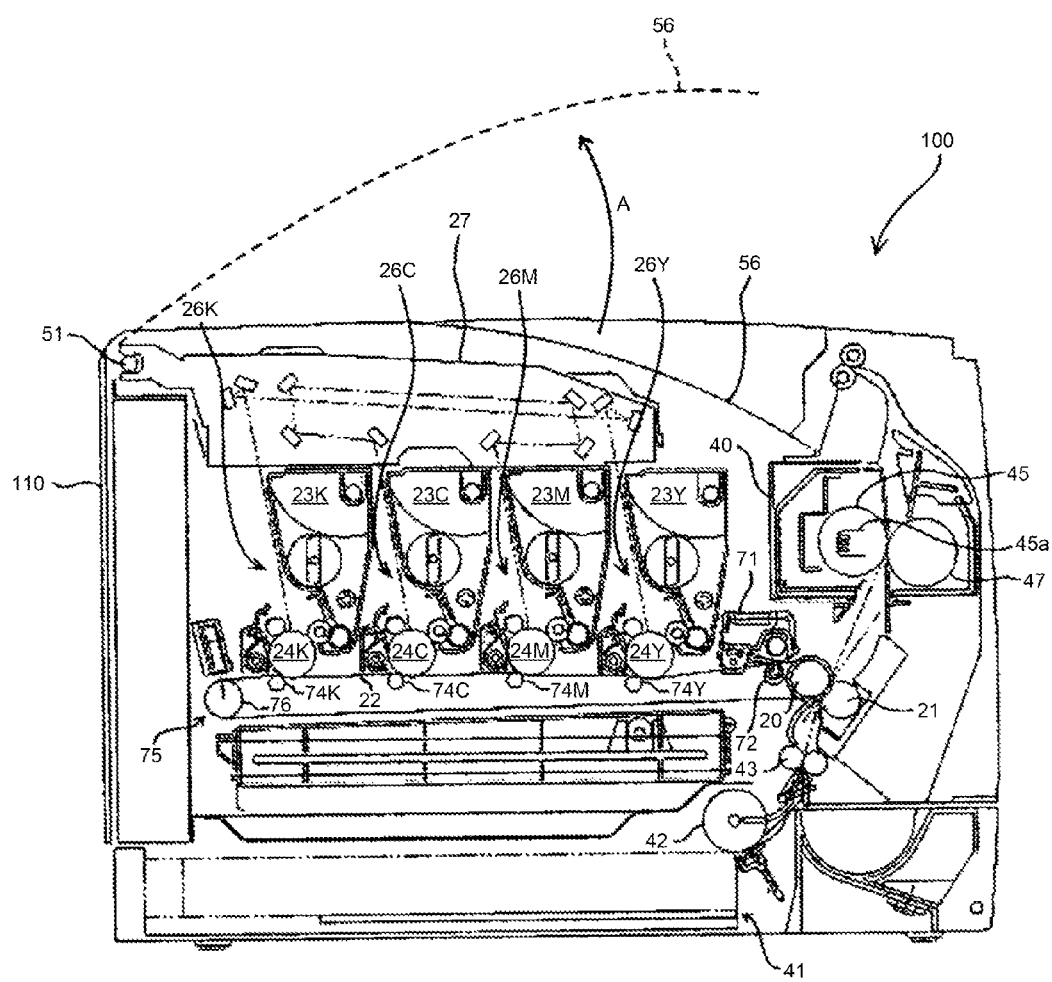
FIG. 2 is a schematic configuration diagram of a printer according to an embodiment of the present invention.

Referring to FIG. 2 which is a schematic configuration diagram illustrating the printer 100, the printer 100 includes four process units 26(K, C, M, and Y) for forming a black (K)-toner image, a cyan (C)-toner image, a magenta (M)-toner image, and a yellow (Y)-toner image, respectively. The process units 26(K, C, M, and Y) are identical in configuration except in using K toner, C toner, M toner, and Y toner of different color as an image-forming substance. Each of the process units 26(K, C, M, and Y) can be replaced when reaching end of its usable life.

Figure 3:
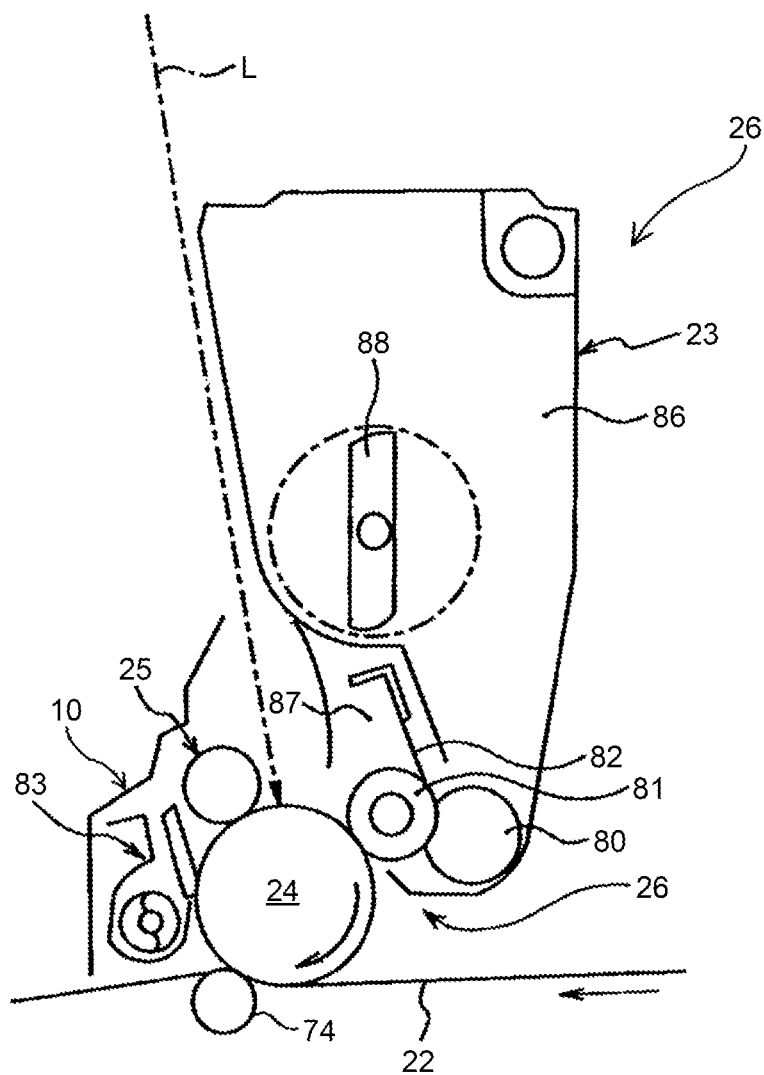
FIG. 3 is a schematic configuration diagram of a process unit of the printer.

FIG. 3 is an enlarged explanatory diagram of one of the four process units 26. The four process units 26 are similar to each other except for the color of the toner to be used. Accordingly, the letters (K, C, M, and Y), each added to the end of reference numerals of elements to indicate a corresponding toner color, are omitted from FIG. 3.

As illustrated in FIG. 3, the process unit 26 includes a photoconductor unit 10 and a developing unit 23. The photoconductor unit 10 includes a drum-like photoconductor 24, which is a latent-image bearer, a photoconductor cleaning device 83, a neutralization device (not shown), and a charging device 25. The process unit 26, which is an image forming unit, is detachably attached to a body of the printer 100 so that consumables can be replaced at one time.

The charging device 25 uniformly charges a surface of the photoconductor 24 that is rotated clockwise in FIG. 3 by a drive unit (not shown). The uniformly-charged surface of the photoconductor 24 is exposed to laser light L scanning the surface. As a result, an electrostatic latent image for a corresponding one of the colors is formed on the surface. The developing unit 23 develops the electrostatic latent image into a toner image using toner (not shown). The toner image is transferred onto an intermediate transfer belt 22, which will be described later. Hereinafter, this transfer process may be referred to as "primary transfer".

The photoconductor cleaning device 83 removes transfer-residual toner adhering to the surface of the photoconductor 24 after the primary transfer. The neutralization device neutralizes residual charges remaining on the photoconductor 24 after the cleaning. By this neutralization, the surface of the photoconductor 24 is initialized to be ready for a next image forming cycle.

A cylindrical drum portion of the photoconductor 24 is produced by covering an outer surface of a hollow aluminum pipe with an organic photoconductive layer. The photoconductor 24 is obtained by attaching flanges each having a drum shaft to both axial ends of the drum portion.

The developing unit 23 includes a vertically-elongated hopper portion 86, which contains toner (not shown) as a developer, and a developing portion 87. An agitator 88 and a toner supply roller 80 are arranged in the hopper portion 86 which is a developer container. The agitator 88 is driven to rotate by a drive unit (not shown). The toner supply roller 80 which is a developer supply member is arranged vertically below the agitator 88 and driven to rotate by a drive unit (not shown). The toner in the hopper portion 86 moves toward the toner supply roller 80 under its own weight while being agitated by the agitator 88 that is driven to rotate. The toner supply roller 80 includes a metal cored bar and a roller portion made of foamed plastic or the like covering the surface of the cored bar. The toner supply roller 80 rotates while causing toner accumulated in an internal lower portion in the hopper portion 86 to adhere to the surface of the toner supply roller 80.

A developing roller 81 and a doctor blade 82 are arranged in the developing portion 87 of the developing unit 23. The developing roller 81 rotates in contact with the photoconductor 24 and the toner supply roller 80. The doctor blade 82 brings its distal end into contact with a surface of the developing roller 81. The toner adhering to the toner supply roller 80 in the hopper portion 86 is supplied to the surface of the developing roller 81 at an abutment part where the developing roller 81 contacts the toner supply roller 80. The thickness of layer of the toner on the surface of the developing roller 81 is adjusted when caused to pass through the abutment position between the doctor blade 82 and the developing roller 81 by rotation of the developing roller 81. After undergoing the layer thickness adjustment, the toner adheres to the electrostatic latent image on the surface of the photoconductor 24 at a developing area, which is an abutment part between the developing roller 81 and the photoconductor 24. Development of the electrostatic latent image into a toner image is thus performed with the toner adhering to the image.

Such toner image formation as described above is performed by each of the process units 26. Consequently, toner images of the respective colors are formed on the respective photoconductors 24 of the process units 26.

As illustrated in FIG. 2, an optical writing unit 27 is arranged vertically above the four process units 26. The optical writing unit 27, which is a latent-image writing device, optically scans the photoconductors 24 of the four process units 26 with the laser light L emitted from a laser diode (not shown) in accordance with image data. By this optical scanning, electrostatic latent images of the respective colors are formed on the photoconductors 24. In the configuration described above, the optical writing unit 27 and the four process units 26 function as an image formation unit which forms K, C, M, and Y toner images, or visible images of different colors, on three or more latent-image bearers.

The optical writing unit 27 irradiates the photoconductor with the laser light L emitted from the light source via multiple optical lenses and mirrors while deflecting the laser light L in the main-scanning direction using a polygon mirror (not shown) driven to rotate by a polygon motor. An optical writing unit configured to perform optical writing with LED (light-emitting diode) light emitted from multiple LEDs of an LED array may alternatively be employed.

A transfer unit 75 is arranged vertically below the four process units 26. The transfer unit 75 is a belt device that causes the endless intermediate transfer belt 22 to revolve counterclockwise in FIG. 2 while supporting the intermediate transfer belt 22 in a stretched closed loop. The transfer unit 75 includes, in addition to the intermediate transfer belt 22, a driving roller 76, a tension roller 20, four primary transfer rollers 74(K, C, M, and Y), a secondary transfer roller 21, a belt cleaning device 71, and a cleaning backup roller 72.

The intermediate transfer belt 22 which is a belt member serving as a transfer belt is supported in the stretched closed loop by the driving roller 76, the tension roller 20, the cleaning backup roller 72, and the four primary transfer rollers 74(K, C, M, and Y) arranged inside the loop. The intermediate transfer belt 22 is revolved counterclockwise in FIG. 2 by a rotational force exerted by the driving roller 76 that is driven to rotate by a drive unit (not shown) in the same direction.

The four primary transfer rollers 74(K, C, M, and Y) and the photoconductors 24 (K, C, M, and Y) pinch the intermediate transfer belt 22 revolved in this manner therebetween. By this pinching, a primary transfer nip is formed at each of four points where the front surface of the intermediate transfer belt 22 is in contact with the photoconductors 24(K, C, M, and Y).

A primary transfer bias is applied from a transfer power source (not shown) to each of the primary transfer rollers 74(K, C, M, and Y). The primary transfer bias induces a transfer electric field between each of the electrostatic latent images on the photoconductors 24(K, C, M, and Y) and the primary transfer rollers 74(K, C, M, and Y). A transfer charger, a transfer brush, or the like may be employed in lieu of the primary transfer rollers 74.

The Y toner image formed on the surface of the photoconductor 24Y of the process unit 26Y for yellow is advanced to enter the primary transfer nip for yellow by rotation of the photoconductor 24Y for yellow. At the primary transfer nip for yellow, the Y toner image is primary-transferred from the photoconductor 24Y for yellow onto the intermediate transfer belt 22 by an action of the transfer electric field and a nip pressure. By the revolving motion of the intermediate transfer belt 22, the Y toner image primary-transferred onto the intermediate transfer belt 22 is caused to pass through the primary transfer nips for M, C, and K, at which the M, C, and K toner images on the photoconductors 24(M, C, and K) are sequentially primary-transferred onto the Y toner image to be overlaid on one another. By this primary transfer which overlays the toner images on one another, four color-toner images are formed on the intermediate transfer belt 22.

The secondary transfer roller 21 of the transfer unit 75 is arranged outside the loop of the intermediate transfer belt 22 in a manner to pinch the intermediate transfer belt 22 between the secondary transfer roller 21 and the tension roller 20 arranged inside the loop. By this pinching, a secondary transfer nip where the front surface of the intermediate transfer belt 22 contacts the secondary transfer roller 21 is formed. A secondary transfer bias is applied from a transfer power source (not shown) to the secondary transfer roller 21. The secondary transfer bias applied in this manner induces a secondary-transfer electric field between the secondary transfer roller 21 and the tension roller 20 which is grounded.

A paper feeding cassette 41 which contains a paper bundle formed by stacking multiple sheets of recording paper is arranged vertically below the transfer unit 75. The paper feeding cassette 41 is attachable and detachable to and from a cabinet of the printer 100 by sliding the paper feeding cassette 41. The paper feeding cassette 41 places a paper feeding roller 42 in contact with an uppermost sheet of the recording paper of the paper bundle and delivers the sheet of the recording paper (hereinafter, the "recording sheet") toward a paper feeding path by rotating the paper feeding roller 42 counterclockwise in FIG. 2 at a predetermined timing point.

A pair of registration rollers 43 including two registration rollers is arranged near a downstream end of the paper feeding path. The pair of registration rollers 43 stops rotations of the rollers immediately upon receiving and pinching therebetween the recording sheet, which is a recording member, delivered from the paper feeding cassette 41. The pair of registration rollers 43 starts rotating again to deliver the recording sheet pinched therebetween to the secondary transfer nip at a timing point which allows synchronizing the recording sheet with the four color-toner images on the intermediate transfer belt 22 in the secondary transfer nip.

The four color-toner images on the intermediate transfer belt 22 are brought into close contact with the recording sheet in the secondary transfer nip and jointly secondary-transferred onto the recording sheet by the action of the secondary-transfer electric field and a nip pressure, thereby forming a full-color toner image against a white background of the recording sheet. Hereinafter, this transfer step may be referred to as "secondary transfer". When the recording sheet on which the full-color toner image is thus formed goes out of the secondary transfer nip, the recording sheet is separated from the secondary transfer roller 21 and the intermediate transfer belt 22 by curvature separation. Thereafter, the recording sheet is delivered into a fixing device 40, which is a fixing unit, via a post-transfer conveyance path.

Transfer-residual toner which has not been transferred to the recording sheet may remain on the intermediate transfer belt 22 exited from the secondary transfer nip. The transfer-residual toner is removed from the belt surface by the belt cleaning device 71 that is in contact with the front surface of the intermediate transfer belt 22. The cleaning backup roller 72 arranged inside the loop of the intermediate transfer belt 22 supports the belt cleaning performed by the belt cleaning device 71 from inside the loop.

The fixing device 40 includes a fixing roller 45 which internally includes a heat source 45a such as a halogen lamp, and a pressure roller 47 which rotates while maintaining contact with the fixing roller 45 with a predetermined pressure. The fixing roller 45 and the pressure roller 47 form a fixing nip therebetween. The recording sheet delivered into the fixing device 40 is pinched in the fixing nip in a manner that brings a surface of the recording sheet, on which the not-fixed-yet toner image is carried, into close contact with the fixing roller 45. Heat and pressure applied at the fixing nip softens toner in the toner image to thereby fix the full-color image.

If one-sided printing mode has been set by manipulating an operating unit (not shown) which includes a numeric keypad and the like or in accordance with a control signal fed from a personal computer (not shown) or the like, the recording sheet discharged out of the fixing device 40 is directly discharged to the outside of the apparatus. Thereafter, the recording sheet is stacked in a stacker which is a top surface of an upper cover 56 of the cabinet.

In the embodiment, the four process units 26(K, C, M, and Y) and the optical writing unit 27 make up a toner-image forming unit which forms toner images.

The upper cover 56 of the cabinet of the printer 100 is supported to be pivotable on a shaft member 51 as indicated by arrow A in FIG. 2. By being rotated counterclockwise in FIG. 2, the upper cover 56 is placed in an open state with respect to the cabinet of the printer 100. In the open state, the upper cover 56 widely exposes a top opening of the cabinet of the printer 100. The optical writing unit 27 is also supported to be pivotable on the shaft member 51. Rotating the optical writing unit 27 counterclockwise in FIG. 2 exposes top surfaces of the four process units 26(K, C, M, and Y).

Attaching/detaching of the process unit 26(K, C, M, Y) is performed with the upper cover 56 and the optical writing unit 27 open. More specifically, the process unit 26(K, C, M, Y) is detached from the body of the printer 100 by exposing the top surface of the process unit 26(K, C, M, Y) by opening the upper cover 56 and the optical writing unit 27 and thereafter pulling out the process unit 26(K, C, M, Y) vertically upward.

Attaching/detaching of the process unit 26, which is frequently performed, with the upper cover 56 and the optical writing unit 27 open, allows a user or a maintenance person to check the attaching/detaching operation while viewing inside the cabinet from above without taking a stressful posture such as a squatting position, a bending-down position or a bowed position. Accordingly, reducing work load and reducing erroneous operations can be achieved.

In the embodiment, the process units 26 each including the photoconductor unit 10 and the developing unit 23 are configured to be attachable and detachable to and from the printer 100. Alternatively, the photoconductor unit 10 and the developing unit 23 may be configured to be separately attachable and detachable to and from the printer 100.

Figure 4:
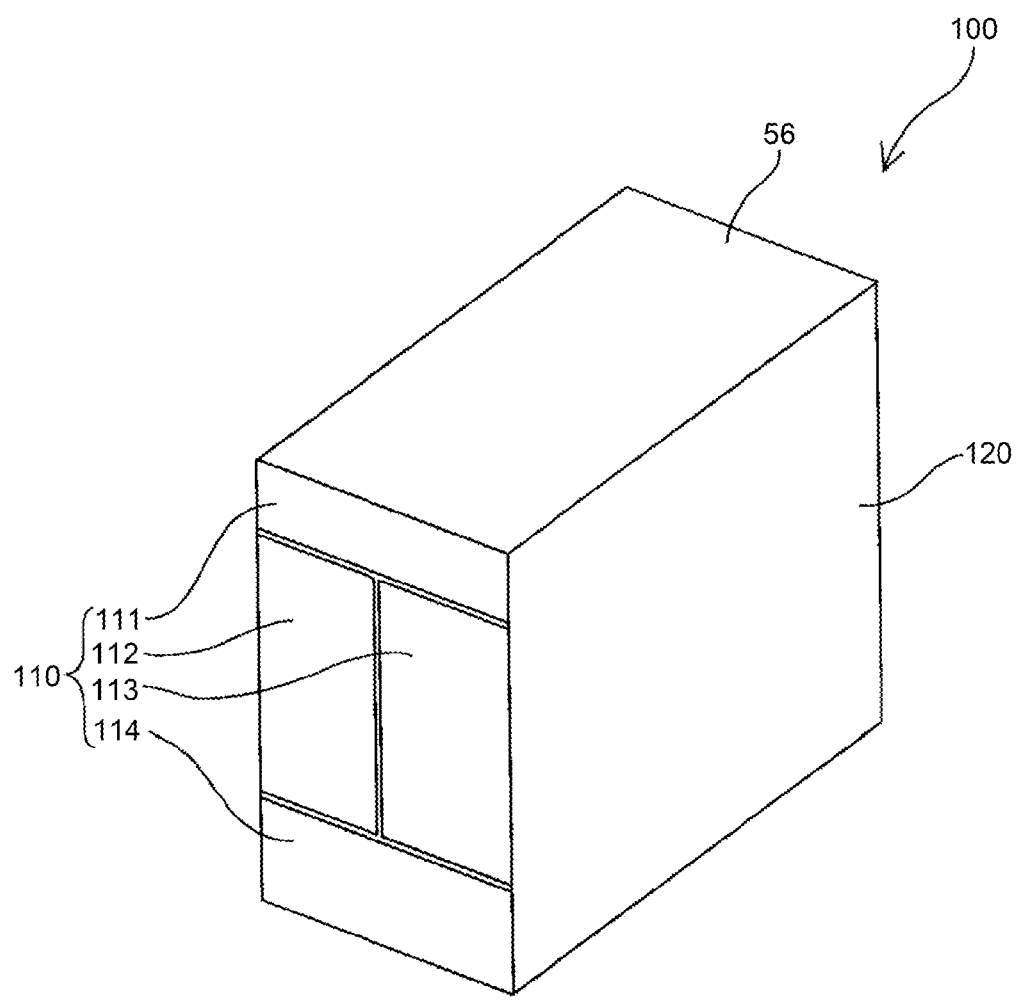
FIG. 4 is a perspective explanatory view of the printer including a left-side cover made up of multiple exterior-cover pieces.

FIG. 4 is a perspective explanatory view of the printer 100, illustrating an exemplary structure configuration in which a left-side cover 110 covering a left-side (in FIG. 2) surface of the printer 100 is formed from multiple exterior-cover pieces.

As illustrated in FIG. 4, the left-side cover 110 is formed from four exterior-cover pieces that are a first left-side cover 111, a second left-side cover 112, a third left-side cover 113, and a fourth left-side cover 114.

The printer 100 includes a body frame 150 (see FIG. 1) which supports various devices for use in image forming. The left-side cover 110 is fixed to the body frame 150 with screws in a state that enables to remove the multiple exterior-cover pieces at maintenance, component replacement, or the like occasion. The body frame may be typically made of a metal such as iron or aluminum. However, the material of the body frame is not limited to a metal and can be any material having sufficient rigidity to support the devices.

Features of the printer 100 are described below.

Figure 1:
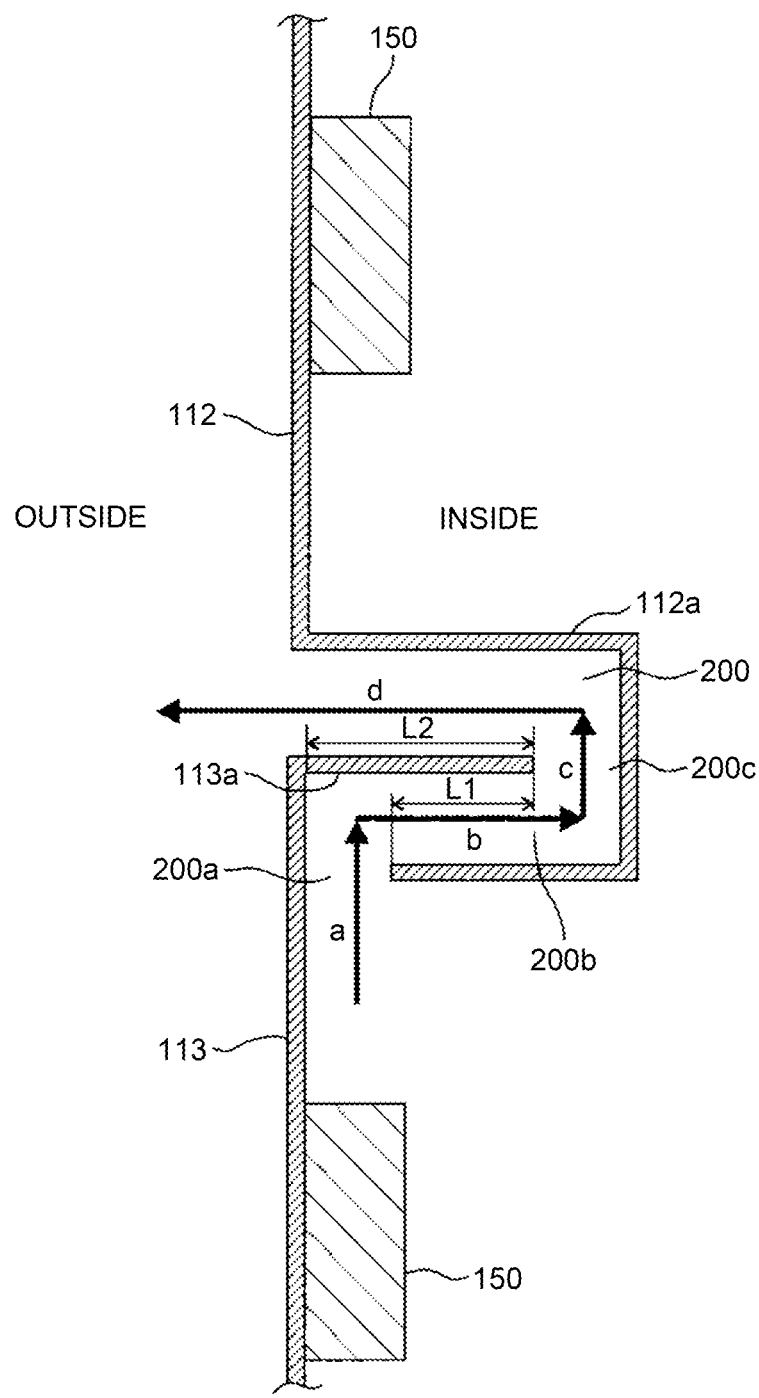
FIG. 1 is an enlarged horizontal cross-sectional view of a boundary between a second left-side cover and a third left-side cover of a printer according to an embodiment of the present invention.

FIG. 1 is an enlarged horizontal cross-sectional top view of a boundary between the second left-side cover 112 and the third left-side cover 113 of the printer 100. Reference numeral "150" in FIG. 1 denotes the body frame. The second left-side cover 112 and the third left-side cover 113 are mounted on the body frame 150 by being pushed thereagainst from the left side in FIG. 1. When mounted, positions of the second left-side cover 112 and the third left-side cover 113 relative to the body of the printer 100 are fixed. When fixed to the body of the printer 100, the exterior-cover pieces including the second left-side cover 112 and the third left-side cover 113 spatially partition the inside from the outside of the printer 100. In FIG. 1, the inside of the printer 100 is on the right side with respect to the second left-side cover 112 and the third left-side cover 113, while the outside of the printer 100 is on the left side.

The body frame 150 fixes, as a positioning member, the positions of the second left-side cover 112 and the third left-side cover 113. The body frame 150 is configured so that, even if the second left-side cover 112 and the third left-side cover 113 are attached to the printer 100, the second left-side cover 112 and the third left-side cover 113 do not contact each other but leave a clearance 200 therebetween.

Because the clearance 200 allows air to pass therethrough, heat generated inside the printer 100 can be discharged to the outside through the clearance 200, and a temperature rise inside the printer 100 can be reduced.

The third left-side cover 113 includes, at one end of the third left-side cover 113 on the side of the second left-side cover 112, a projecting cover section 113a which is inwardly projecting. The second left-side cover 112 includes, at one end of the second left-side cover 112 on the side of the third left-side cover 113, a projecting-cover-section accommodating section 112a which is configured so as to surround three sides of the projecting cover section 113a. The projecting cover section 113a faces the projecting-cover-section accommodating section 112a without contact between a surface of the projecting cover section 113a and a surface of the projecting-cover-section accommodating section 112a, thereby creating the clearance 200.

A passage defined by the clearance 200 and leading from the inside to the outside of the printer 100 through the clearance 200 has a shape with multiple bends.

The printer 100 emits various sounds including operating sounds of drive motors from which rotations are transmitted to various rollers, sounds caused by movements of moving members such as the various rollers, and rotational sound of the polygon mirror of the optical writing unit 27. If transmitted to the outside of the printer 100, such sound can be a noise uncomfortable to people near the printer 100. The exterior-cover pieces which spatially partition the inside from the outside of the printer 100 can reduce transmission of the sounds emitted inside of the printer 100 to the outside, thereby suppressing noise emission.

As illustrated in FIG. 1, the clearance 200 is left between the second left-side cover 112 and the third left-side cover 113. The clearance 200 assumes the labyrinthine shape having the multiple bends. Accordingly, sound waves emitted inside the printer 100 and traveling toward the outside through the clearance 200 are not allowed to go out of the printer 100 unless the sound waves are diffracted multiple times.

Thus, sound leakage can be suppressed while preventing a temperature rise inside the printer 100 by providing the clearance 200 between the exterior-cover pieces or, in other words, by allowing air to flow between the inside and the outside of the printer 100.

More specifically, a portion of sound waves traveling as indicated by arrow "a" in FIG. 1 is diffracted at a first diffraction opening 200a and travels as indicated by arrow "b". The first diffraction opening 200a is a portion of the clearance 200 between a distal-end surface of the projecting-cover-section accommodating section 112a and an inner wall of the third left-side cover 113.

The portion of the sound waves traveling as indicated by the arrow "b" is diffracted at a second diffraction opening 200b and travels as indicated by arrow "c". The second diffraction opening 200b is a portion of the clearance 200 between a surface, which is next to the distal-end surface, of the projecting-cover-section accommodating section 112a and a distal end portion of the projecting cover section 113a.

Furthermore, the portion of the sound waves traveling as indicated by the arrow "c" is diffracted at a third diffraction opening 200c and travels as indicated by arrow "d". The third diffraction opening 200c is a portion of the clearance 200 between a distal-end surface of the projecting cover section 113a and a surface, which faces the distal-end surface of the projecting cover section 113a, of the projecting-cover-section accommodating section 112a.

By employing this structure configuration that does not allow sound waves emitted inside the printer 100 to leak out from the printer 100 unless the sound waves are diffracted multiple times in this manner, a temperature rise inside the printer 100 can be reduced while obtaining a sound-shielding effect without utilizing an additional member.

The printer 100 is an electronic equipment that includes drive devices and the optical writing unit 27, each of which can be a sound source that emits sound when in operation, and further includes the exterior-cover pieces which form the cabinet that covers these devices which can be sound sources. Providing the labyrinthine clearance 200 at a boundary between adjacent ones of the exterior-cover pieces of the printer 100 enables to reject heat generated by operation of the printer 100 through the clearance 200, thereby reducing a temperature rise inside the cabinet of the printer 100. Furthermore, the labyrinthine shape of the clearance 200 enables to reduce leakage of operating sounds of the printer 100 to the outside.

As illustrated in FIG. 1, the clearance 200 has three bends. Accordingly, the clearance 200 is capable of diffracting sound waves traveling to the outside therethrough a larger number of times than a clearance having two bends, and therefore can enhance the sound-leakage prevention effect.

In the structure configuration illustrated in FIG. 1, the labyrinthine clearance 200 is created between the two exterior-cover pieces. Alternatively, a structure configuration in which a portion of the body frame 150 creates a portion of the clearance 200 may be employed. In this alternative structure configuration, the portion of the body frame 150 functions as a cover member.

The cover members that form therebetween the clearance according to an aspect of the invention may alternatively be interior-cover pieces (which may referred to as "inner-cover pieces") arranged inside the exterior-cover pieces so as to be exposed when at least one of the exterior-cover pieces is removed or when one or more exterior-cover pieces, which are operable to open and close, of the exterior-cover pieces is opened.

The cover members that leave therebetween the clearance according to an aspect of the invention are not limited to the exterior-cover pieces or the interior-cover pieces of the image forming apparatus. Alternatively, the cover members may be cover members of a cabinet structure of a device, such as the optical writing unit 27 or one or more of the drive devices, arranged inside the image forming apparatus.

Japanese Laid-open Patent Application No. 2006-293221 discloses a structure configuration in which a clearance having only a single bend is left at a boundary between two exterior-cover pieces. However, if the clearance has only the single bend, sound waves obliquely entering the bend can travel straight without undergoing diffraction at the bend and eventually leak to the outside of the image forming apparatus. By contrast, the clearance 200 according to the embodiment has the multiple bends and, accordingly, can reduce leakage of sound waves traveling straight and reduce sound leakage.

The clearance 200 is sized to permit fluctuations in tolerances of components including the second left-side cover 112 and the third left-side cover 113. More specifically, dimensions of the clearance 200 are set to such values that will not cause the clearance 200 to be closed by the second left-side cover 112 and the third left-side cover 113 even in a condition of the component tolerances that narrows the clearance 200 most.

Accordingly, heat can be dissipated through the clearance 200 and, accordingly, a temperature rise inside the printer 100 can be reduced.

In the structure configuration illustrated in FIG. 1, both of the second left-side cover 112 and the third left-side cover 113, which leave the clearance 200, are fixed cover members fixed to the body frame 150, which is a body of the cabinet structure of the printer 100, with the screws. As being fixed cover members, the two cover members, or the second left-side cover 112 and the third left-side cover 113, can be arranged without leaving a clearance at the boundary therebetween. However, provision of the clearance 200 allows heat to dissipate through the clearance 200, thereby reducing a temperature rise inside the printer 100. Furthermore, arranging the cover members so as to leave the clearance 200 therebetween advantageously prevents galling, which is a wear caused by sliding contact between the cover members adjacent to each other, that would otherwise occur when attaching one of the cover members in a state where the other one of the cover members is fixed. Hence, occurrence of a damage such as a scratch resulting from galling can be prevented.

Furthermore, in a structure configuration where the exterior-cover pieces are arranged with no clearance therebetween, even a slight deviation from the component tolerances can cause the galling described above to occur or cause the exterior-cover pieces to interfere with each other. By contrast, in the structure configuration where the exterior-cover pieces leave the clearance 200 therebetween, even if there is a slight deviation from the component tolerances, the exterior-cover pieces will not contact each other, and the galling or the interference described above can be prevented. As a result, component tolerances are broadened, which leads to a reduction in manufacturing cost.

It is desirable to arrange a more-frequently-attached/detached one of the exterior-cover pieces, or the second left-side cover 112 and the third left-side cover 113, which leave the clearance 200 therebetween on the outer side. In the structure configuration illustrated in FIG. 1, the third left-side cover 113 is arranged on the outer side at a portion where the clearance 200 is left. In the structure configuration illustrated in FIG. 1, only the third left-side cover 113 that is on the outer side at the portion where the clearance 200 is left can be detached. If an attempt of detaching only the second left-side cover 112 is made, the projecting-cover-section accommodating section 112a that is on the inner side of the projecting cover section 113a of the third left-side cover 113 is snagged on the projecting cover section 113a, thereby making it difficult to detach only the second left-side cover 112. Accordingly, the second left-side cover 112 is to be detached together with the third left-side cover 113.

If the third left-side cover 113 that is detachable singly is the exterior-cover piece that is more frequently attached/detached than the second left-side cover 112, the detachment can be facilitated. Hence, this structure configuration allows, even with the labyrinth-shaped clearance at the boundary between the exterior-cover pieces adjacent to each other, to maintain serviceability by reducing a drop in efficiency in maintenance and replacement works.

Meanwhile, an occasion to detach an exterior-cover piece fixed to the cabinet of the printer 100 is substantially limited to replacement or a like operation performed by a maintenance person. Accordingly, arranging a more-likely-to-be-detached one of the two exterior-cover pieces on the outer side can prevent an undesirable situation that the other exterior-cover piece is mistakenly opened (For example, the more-likely-to-be-detached exterior-cover piece may be an exterior-cover piece facing a drive device; this is because a clutch included in the drive device can possibly be replaced).

The length (L1 and L2 in FIG. 1) of portions, at which the second left-side cover 112 and the third left-side cover 113 overlap with each other with the clearance 200 therebetween, in directions along which the passage defined by the clearance 200 extends, is preferably 3.0 millimeters or greater. Setting the length of the portions, at which the exterior-cover pieces that leave the clearance 200 therebetween overlap with each other with the clearance 200 therebetween, to such a certain value prevents an undesirable situation that a portion of sound waves that is not diffracted in the clearance 200 leaks to the outside.

The second left-side cover 112 and the third left-side cover 113 that leave the clearance 200 therebetween described with reference to FIGS. 1 and 2 are the two exterior-cover pieces arranged to be laterally (in the horizontal direction) adjacent to each other. However, embodiments of the present invention are not limited to such exterior-cover pieces arranged laterally adjacent to each other. For example, an embodiment may be implemented in a structure configuration where the same labyrinthine clearance as the clearance 200 is left at a boundary of exterior-cover pieces that are vertically adjacent to each other as the first left-side cover 111 and the second left-side cover 112.

The structure configuration that creates the labyrinthine clearance described above with reference to FIG. 1 is applicable to adjacent two exterior-cover pieces configured as hinged cover members each of which is operable to open and close about a pivot shaft.

FIGS. 5A and 5B are explanatory diagrams of a structure configuration where the third left-side cover 113, which is one of the exterior-cover pieces that leave the clearance 200 therebetween, is a hinged cover member operable to open and close. FIG. 5A is an explanatory diagram of a state where the third left-side cover 113 is being closed. FIG. 5B is an explanatory diagram of a state immediately after the third left-side cover 113 is closed with a force greater than necessary. The structure configuration illustrated in FIGS. 5A and 5B differs from that illustrated in FIG. 1 in that the third left-side cover 113 is a hinged cover member operable to open and close.

In the structure configuration illustrated in FIGS. 5A and 5B, the third left-side cover 113 is pivotable on a third-left-side-cover pivot shaft 113b. When the third left-side cover 113 in an open state is pressed by a user or a maintenance person in a direction indicated by arrow E in FIG. 5A, the third left-side cover 113 moves until it contacts the body frame 150. The third left-side cover 113 can thus be closed.

The position of a hinged cover such as the third left-side cover 113 in a closed state is determined by a positioning member such as the body frame 150. However, there can be a situation where the hinged cover is elastically deformed as is the third left-side cover 113 indicated by solid lines in FIG. 5B. The clearance 200 is desirably sized so that, even in such a situation, a clearance indicated by α and β in FIG. 5B is left between the two exterior-cover pieces which are the second left-side cover 112 and the third left-side cover 113, thereby preventing a contact between the exterior-cover pieces. Setting the clearance 200 in this manner prevents a damage resulting from contact between the exterior-cover pieces, thereby preventing reduction, which would otherwise be caused by the damage, in the sound-leakage suppressing effect.

In the structure configuration illustrated in FIGS. 5A and 5B, the labyrinthine clearance 200 is left between one end of the third left-side cover 113, which is the hinged cover member, on the side opposite from the third-left-side-cover pivot shaft 113b and the second left-side cover 112. The reason therefor is described below. Because movable range of a hinged cover member is largest at one end on the side opposite from its pivot shaft, it is required to make the clearance at a boundary between the hinged cover member and another cover member wide at the one end. This makes the one end vulnerable to sound leakage. However, sound leakage can be reduced even in such a structure configuration that leaves a wide clearance by imparting a labyrinthine shape to the clearance.

The clearance 200 is desirably sized as follows so as not to cause contact between the two exterior-cover pieces in the closed state. In a state where the third left-side cover 113 has been closed, the third left-side cover 113 is positioned as indicated by dashed lines in FIG. 5B. However, if the third left-side cover 113 is closed with a force greater than necessary, the third left-side cover 113 is brought into contact with the body frame 150 and then elastically deformed while moving to the position indicated by the solid lines in FIG. 5B. The clearance 200 is desirably sized to be greater than an excessively-pushed distance W (FIG. 5B), which is the difference between the lateral position of the distal end of the third left-side cover 113 indicated by the dashed lines and that indicated by the solid lines.

It is desirable to set the excessively-pushed distance W using the position of the distal end of the third left-side cover 113 in a state where the third left-side cover 113 is deformed maximumly within its limit of elastic deformation as the position of the distal end of the third left-side cover 113 indicated by the solid lines in FIG. 5B. Meanwhile, it is unnecessary to take into consideration a situation where the third left-side cover 113 is deformed beyond its limit of elastic deformation. This is because when deformed beyond its limit, the third left-side cover 113 is plastically deformed into a damaged state and therefore cannot be used any more. By contrast, when the third left-side cover 113 is deformed within its limit of elastic deformation, the third left-side cover 113 is not in a damaged state and continues to be usable. Accordingly, by setting the excessively-pushed distance W using the position of the distal end of the third left-side cover 113 deformed maximumly within its limit of elastic deformation, contact between the third left-side cover 113 and the second left-side cover 112 can be prevented even though the third left-side cover 113 is deformed within an extent at which the third left-side cover 113 continues to be usable.

Figure 6:
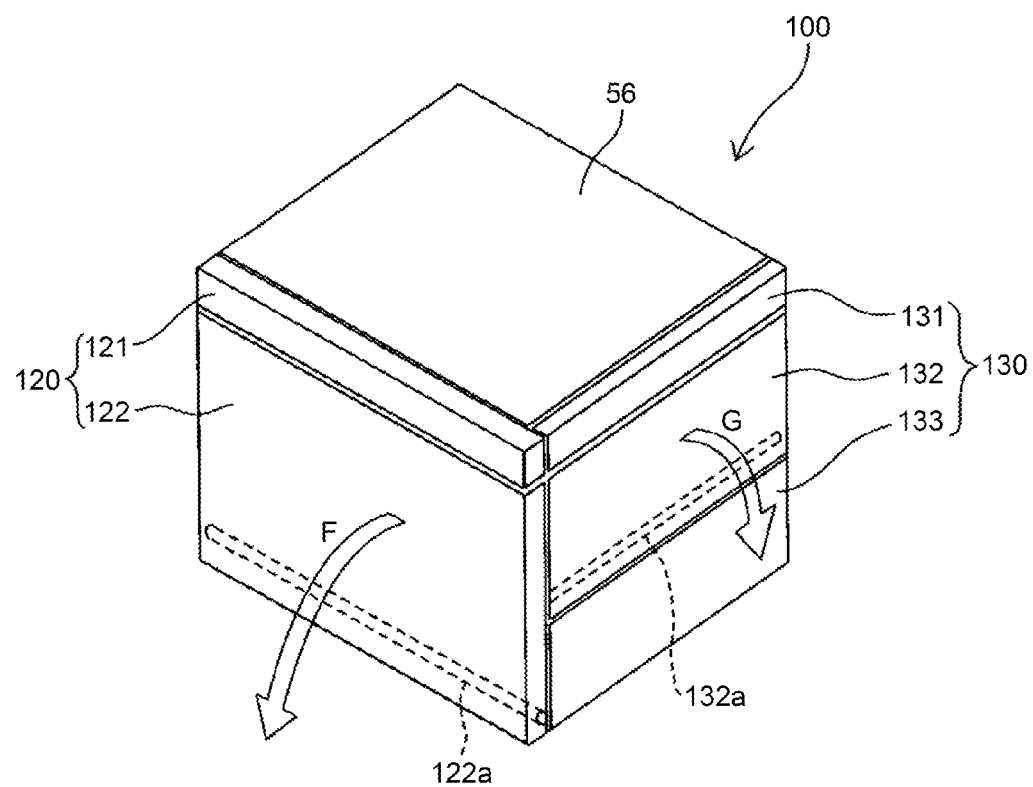
FIG. 6 is a perspective explanatory view of the printer, illustrating an example of a structure configuration in which each of a front cover and a right-side cover individually includes a hinged cover member.

FIG. 6 is a perspective explanatory view of the printer 100, illustrating an example of a structure configuration where each of a front cover 120 which covers the near-side surface in FIG. 2 of the printer 100 and a right-side cover 130 which covers the right-side surface of the same includes a hinged cover member.

The front cover 120 includes an upper front cover 121, which is a fixed cover member fixed to the body frame 150, and a hinged front cover 122, which is a hinged cover member pivotable on a front-cover pivot shaft 122a.

The right-side cover 130 includes an upper right-side cover 131 and a lower right-side cover 132, which are fixed cover members fixed to the body frame 150, and a hinged right-side cover 133, which is a hinged cover member pivotable on a right-cover pivot shaft 132a.

The hinged front cover 122 can be opened by being pivoted on the front-cover pivot shaft 122a in a direction indicated by arrow F in FIG. 6. The right-side cover 130 can be opened by being pivoted on the right-cover pivot shaft 132a in a direction indicated by arrow G in FIG. 6.

The pivot shaft of the third left-side cover 113 described above with reference to FIGS. 5A and 5B extends vertically. However, such a structure configuration as illustrated in FIGS. 5A and 5B that creates the labyrinthine clearance 200 at a boundary between a hinged cover member and another cover member is also applicable to a structure configuration where the pivot shaft of the hinged cover member extends horizontally as in the case of the hinged front cover 122 and the hinged right-side cover 132.

An image forming apparatus such as the printer 100 is typically required to include a hinged cover member, such as the hinged front cover 122 or the hinged right-side cover 132, to be opened and closed when clearing a paper jam and when adding sheets of paper. However, if sound emitted inside the apparatus should leak to the outside through the clearance between such a hinged cover member and the other exterior-cover piece, the sound can be noise. If a structure configuration where the hinged cover member and the other exterior-cover piece are overlapped in contact with each other with no clearance therebetween should be employed, even a slight deviation from component tolerances can cause galling or interference between the exterior-cover pieces to occur.

Accordingly, it is difficult not to leave a clearance with the structure configuration where the hinged cover member and the other exterior-cover piece are overlapped in contact with each other. To eliminate the clearance, it is required to add an elastic member, such as a foamed plastic member, to a boundary portion between the hinged cover member and the other exterior-cover piece. However, adding such an elastic member to the exterior-cover pieces increases the number of components and can lead to an increase in manufacturing cost. Furthermore, because no clearance is provided, heat inside the apparatus cannot be dissipated along the boundary between the hinged cover member and the other exterior-cover piece.

By contrast, the structure configuration that leaves the labyrinthine clearance 200 at the boundary between the hinged cover member and the other exterior-cover piece allows heat inside the printer 100 to dissipate through the clearance 200, thereby reducing a temperature rise while reducing leakage of sound from inside to the outside of the apparatus. Furthermore, because the need of adding an elastic member to the boundary portion between the exterior-cover pieces is eliminated, an increase in manufacturing cost can be reduced.

The printer 100 illustrated in FIG. 6 has a portion where the two hinged covers, which are the hinged front cover 122 and the hinged right-side cover 132, are adjacent to each other.

Figure 7:
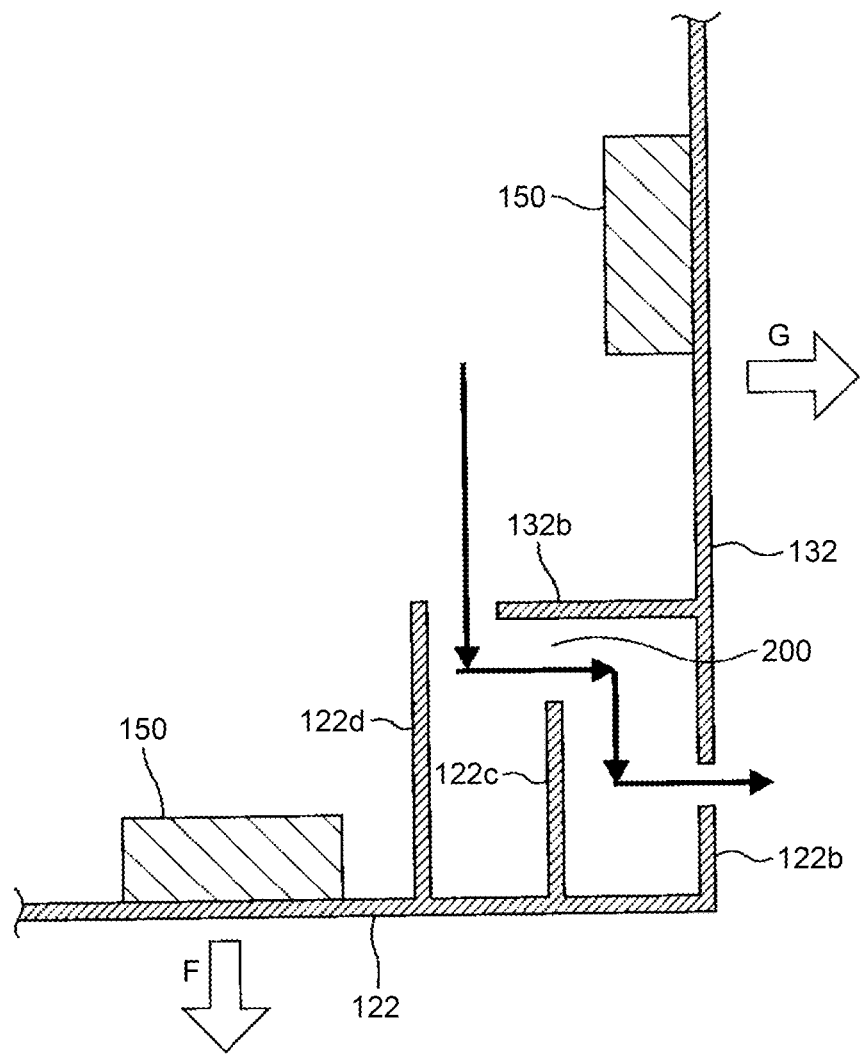
FIG. 7 is an enlarged horizontal cross-sectional view of a boundary between a hinged front cover and a hinged right-side cover of the printer.

FIG. 7 is an enlarged horizontal cross-sectional top view of the boundary between the hinged front cover 122 and the hinged right-side cover 132 of the printer 100. The arrow F and the arrow G in FIG. 7 respectively indicate the direction in which the hinged front cover 122 is opened and the direction in which the hinged right-side cover 132 is opened as described earlier with reference to FIG. 6.

The hinged right-side cover 132 includes a hinged-right-side-cover projection 132b projecting toward the inside of the apparatus at a position slightly farther away from the hinged front cover 122 than an end of the hinged right-side cover 132 on the side of the hinged front cover 122. The hinged front cover 122 includes a hinged-front-cover first projection 122b, a hinged-front-cover second projection 122c, and a hinged-front-cover third projection 122d, which are arranged in this order from an end of the hinged front cover 122 on the side of the hinged right-side cover 132 and each projecting toward the inside of the apparatus.

The clearance 200 between the hinged front cover 122 and the hinged right-side cover 132 assumes the labyrinthine shape with multiple bends provided by the above-described multiple projections (132b, 122b, 122c, and 122d) and inner walls of the exterior-cover pieces. Accordingly, sound waves emitted inside the printer 100 and traveling toward the outside through the clearance 200 are not allowed to go out of the printer 100 unless the sound waves are diffracted multiple times as in the structure configuration described earlier with reference to FIG. 1.

By employing the structure configuration that does not allow sound waves emitted inside the printer 100 to leak out from the printer 100 unless the sound waves are diffracted multiple times in this manner, a temperature rise inside the printer 100 can be reduced while obtaining a sound-shielding effect.

If both of the cover members that leave the clearance 200 therebetween are hinged cover members as are the hinged front cover 122 and the hinged right-side cover 132, usability will be impaired unless the hinged cover members are operable to open and close irrespective of which one of the hinged cover members is operated first. Meanwhile, sound leakage is more likely to occur at a portion where two hinged cover members are adjacent to each other. This is because the clearance at this portion is made wider than those at portions where other cover members are adjacent to each other by taking into consideration of the movable range. Even with such a disadvantageous condition as described above, sound leakage can be reduced by such a structure configuration which diffracts sound waves multiple times as illustrated in FIG. 7.

In the structure configuration including the hinged covers as illustrated in FIGS. 5A to 6, the clearance 200 is sized so as to permit fluctuations in tolerances of components including the second left-side cover 112 and the third left-side cover 113 and fluctuations in clearances of movable units. More specifically, the dimensions of the clearance 200 are set to such values that will not cause the clearance 200 to be closed by the second left-side cover 112 and the third left-side cover 113 even in a condition of the component tolerances and the clearances of movable units that narrows the clearance 200 most.

Accordingly, heat can be dissipated through the clearance 200 and, as a result, a temperature rise inside the printer 100 can be reduced.

Figure 8:
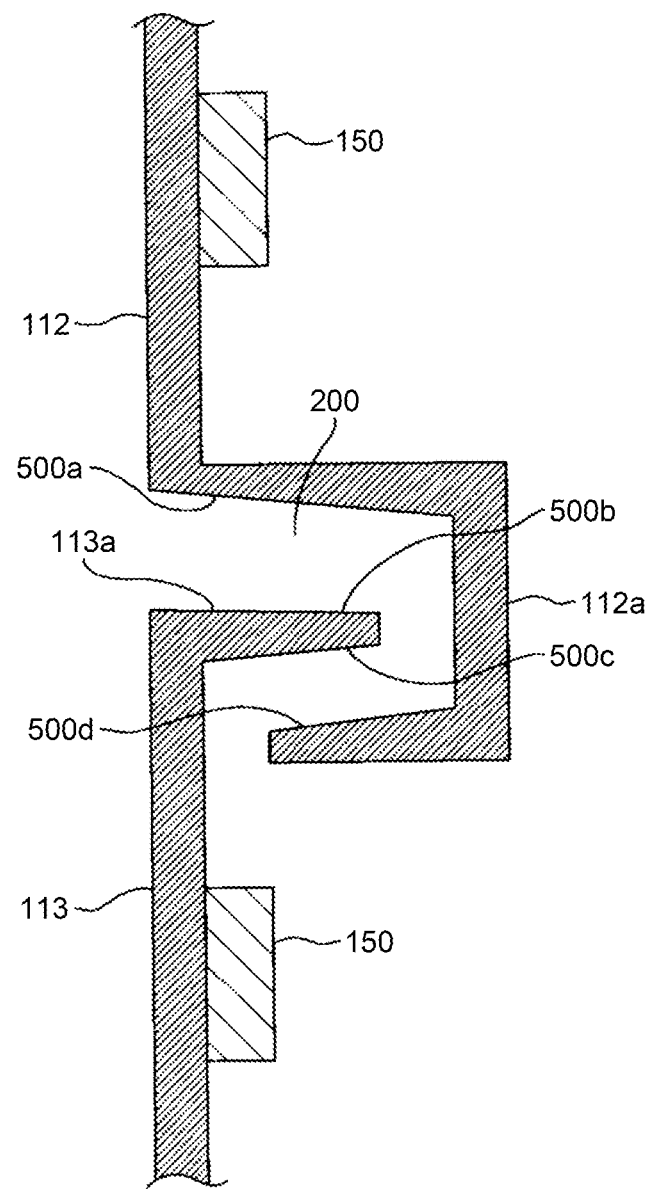
FIG. 8 is an enlarged horizontal cross-sectional view of the boundary between the second left-side cover and the third left-side cover each having tapered shapes.

FIG. 8 is an enlarged horizontal cross-sectional view of the boundary between the second left-side cover 112 and the third left-side cover 113 of the printer 100, in which the projecting cover section 113a and the projecting-cover-section accommodating section 112a that leave the clearance 200 therebetween have tapered shapes 500(a, b, c, and d).

The structure configuration illustrated in FIG. 8 differs from that illustrated in FIG. 1 only in having the tapered shapes 500(a, b, c, and d). Having the tapered shapes 500(a, b, c, and d) makes contact between the exterior-cover pieces less likely to occur when mounting the second left-side cover 112 or the third left-side cover 113, thereby facilitating mounting the exterior-cover pieces.

Figure 9A:
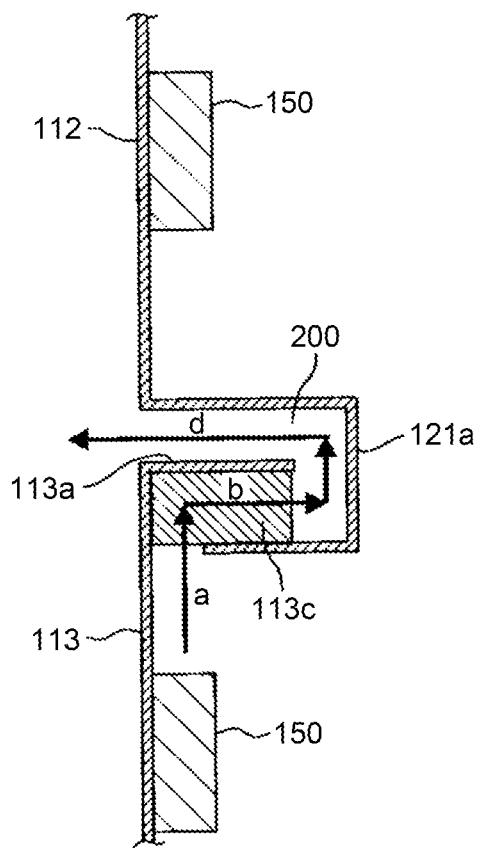
FIGS. 9A and 9B are explanatory diagrams of a structure configuration in which a rib is arranged on a portion of a projecting cover section, with FIG. 9A being an enlarged horizontal cross-sectional view of the boundary between the second left-side cover and the third left-side cover, FIG. 9B being an explanatory diagram of the third left-side cover as viewed from the right side of FIG. 9A.
Figure 9B:
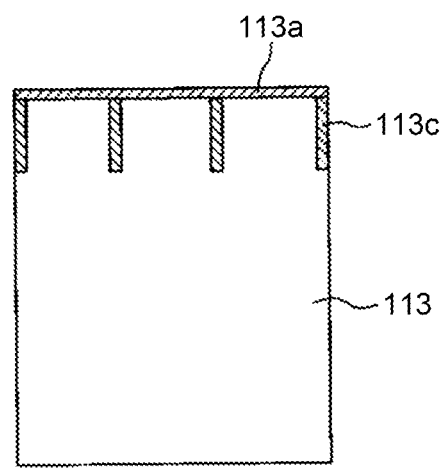

FIGS. 9A and 9B are explanatory diagrams of a structure configuration where a rib 113c, which is a protrusion, is arranged on a portion of the projecting cover section 113a of the third left-side cover 113 that creates the clearance 200. FIG. 9A is an enlarged horizontal cross-sectional view of the boundary between the second left-side cover 112 and the third left-side cover 113. FIG. 9B is an explanatory diagram of the third left-side cover 113 as viewed from the right side of FIG. 9A.

As illustrated in FIGS. 9A and 9B, the rib 113c contacting the second left-side cover 112 is arranged on a surface of the third left-side cover 113 at the portion where the exterior-cover pieces that leave the clearance 200 therebetween overlap with each other with the clearance 200 therebetween.

The rib 113c allows to maintain the distance between the third left-side cover 113 and the second left-side cover 112 constant, thereby preventing deformation of the labyrinthine shape of the clearance 200. As a result, a disadvantageous situation that the clearance 200 is crushed into a sealed state or that the clearance 200 is widened more than necessary is prevented, and the size of the clearance 200 can be maintained constant.

FIGS. 10A and 10B are top views of a structure configuration where the clearance 200 has three bends as in the embodiment described above, schematically illustrating the projecting cover section 113a and the projecting-cover-section accommodating section 112a that are deformed. FIG. 10A is an explanatory diagram of pre-deformation. FIG. 10B is an explanatory diagram of post-deformation.

Figure 11A:
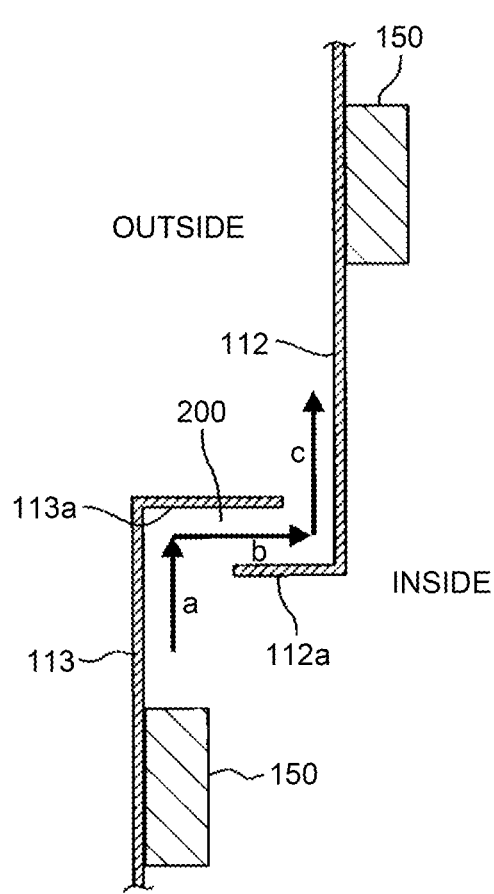
FIGS. 11A and 11B are top views of a structure configuration with two bends, schematically illustrating the projecting cover section and the projecting-cover-section accommodating section that are deformed, with FIG. 11A being an explanatory diagram of pre-deformation, FIG. 11B being an explanatory diagram of post-deformation.
Figure 11B:
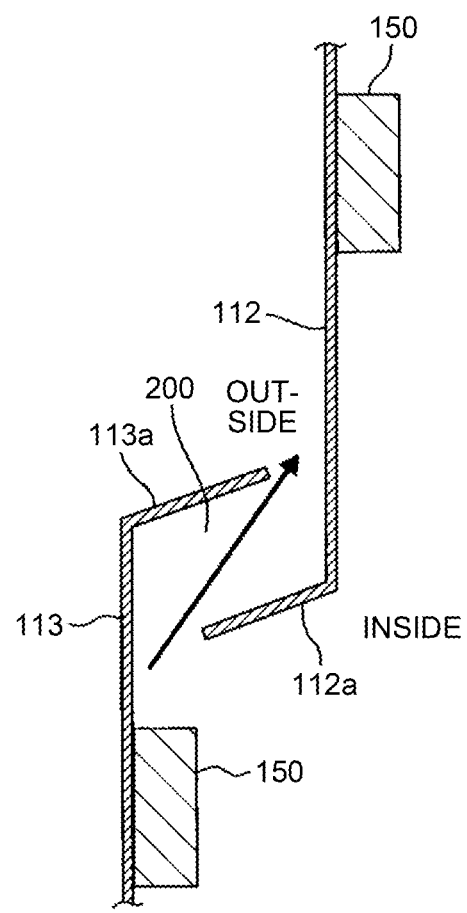

FIGS. 11A and 11B are top views of a structure configuration where the clearance 200 has two bends, schematically illustrating a state where the projecting cover section 113a and the projecting-cover-section accommodating section 112a that are deformed. FIG. 11A is an explanatory diagram of pre-deformation. FIG. 11B is an explanatory diagram of post-deformation.

In the structure configuration where the clearance 200 has two or less bends as illustrated in FIGS. 11A and 11B, it is difficult to maintain the shape which diffracts sound waves if the parts (113a and 112a) that leave the clearance 200 therebetween are undesirably deformed under some force as illustrated in FIG. 11B. Therefore, if a portion of the parts that leave the clearance 200 therebetween is deformed, the effect of reducing sound leakage by diffracting sound waves may possibly not be maintained any more.

By contrast, in the structure configuration where the clearance 200 has three or more bends as illustrated in FIGS. 10A and 10B, sound waves are transmitted to the outside after undergoing diffraction three or more times. This structure configuration can advantageously maintain the shape that diffracts sound waves even if the parts (113a and 112a) that leave the clearance 200 therebetween are somewhat deformed. Accordingly, it is expected that the sound-leakage suppressing effect can be maintained.

In the present embodiment, the example in which the cabinet structure including cover members is the cabinet of the image forming apparatus has been described. Embodiments of the present invention are also applicable to any electronic equipment other than an image forming apparatus so long as the electronic equipment includes a sound source that emits sound when in operation and a sound absorbing device configured to absorb the sound emitted from the sound source.

Applications of the structure configuration that creates the clearance which is a feature of the embodiments of the present invention are not limited to electronic equipment. The structure configuration is applicable to any cabinet structure for which reduction in sound leakage from inside to outside of the cabinet is desired.

Figure 12:
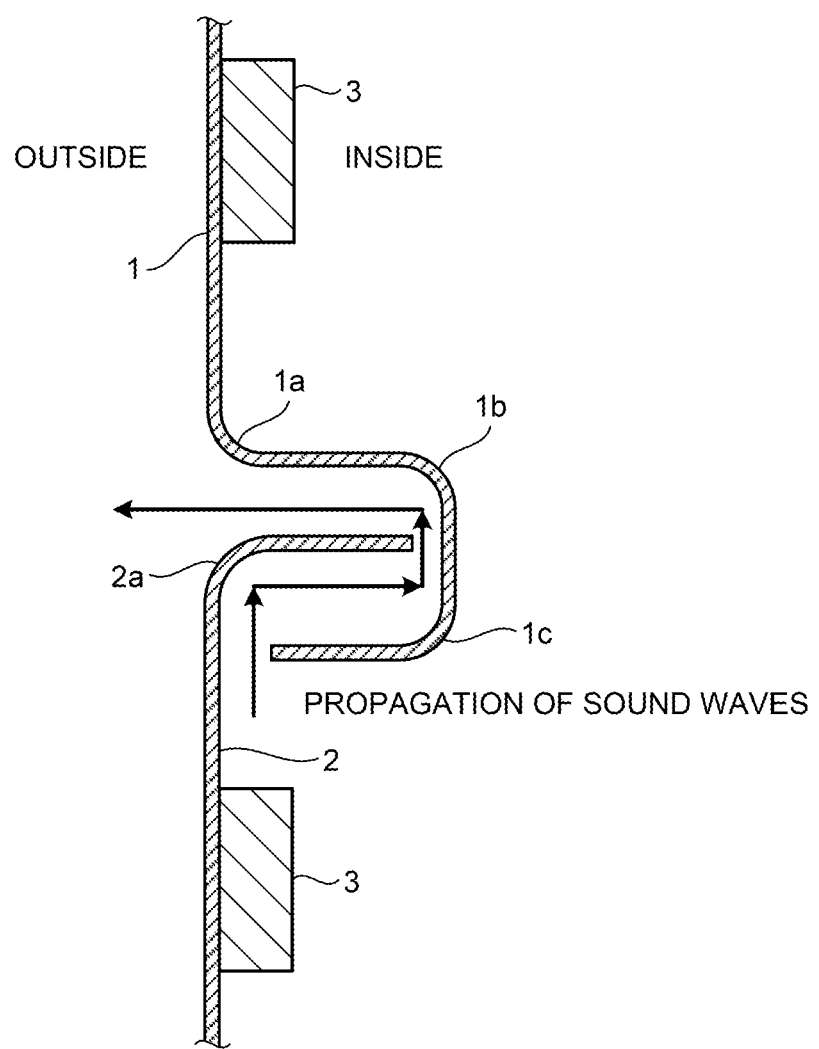
FIG. 12 is a diagram illustrating cross sections of the cover members and a positioning member (structure body).

FIG. 12 is a diagram illustrating cross sections of the cover members 1 and 2, and a positioning member (structure body) 3. The right side of the figure is the inside of the electric equipment and the left side of the figure is the outside of the electric equipment. In the figure, each of bent parts 1a, 1b, 1c and 2a of the cover members is continuously connected, whereby following advantageous effects are expected in addition to FIG. 1 of the present application.

A stress concentration is prevented and a durability of cover members is improved.

It is less likely for an assembling worker and a user to get injured because of smoothness of cover members.

Embodiments described above are merely examples, and the present invention provide advantage(s) specific to each of the following aspects.

According to one aspect (aspect A), a cabinet structure, which may be an exterior cover of the printer 100, includes multiple cover members, which may be the second left-side cover 112 and the third left-side cover 113, that spatially partition the inside from the outside of the cabinet. A clearance, which may be the clearance 200, communicating between the inside and the outside of the cabinet is left between two cover members, which are adjacent to each other, of the multiple cover members. A passage defined by the clearance and leading from the inside to the outside of the cabinet through the clearance has a shape with multiple bends.

Accordingly, as described earlier in the embodiment, air is allowed to move through the clearance that is left between the adjacent cover members. As a result, heat accumulation inside the cabinet is prevented, and a temperature rise inside the cabinet can be suppressed. Furthermore, because the clearance has the complicated shape with the multiple bends, sound waves emitted inside the cabinet and traveling toward the outside through the clearance are not allowed to go out of the cabinet unless the sound waves are diffracted multiple times. Because sound waves are weakened by being diffracted multiple times, even if the structure configuration having the clearance is employed, sound leakage through the clearance can be suppressed. Thus, the cabinet structure including the multiple cover members according to aspect A can advantageously reduce sound leakage while suppressing a temperature rise in the cabinet.

According to aspect B, in the cabinet structure according to aspect A, the number of the bends is three or more.

Accordingly, as described earlier in the embodiment, because the clearance having the three or more bends increases the number of times that sound waves traveling toward the outside are diffracted as compared with a clearance having only two bends, the sound-leakage prevention effect can be enhanced. Furthermore, having the three or more bends allows maintaining the structure that diffracts sound waves even when a portion of the parts that leave the clearance, which may be the clearance 200, therebetween is deformed, thereby maintaining the sound-leakage suppressing effect.

According to aspect C, in the cabinet structure according to aspect A or B, both of the two cover members, which may be the second left-side cover 112 and the third left-side cover 113, that leave the clearance, which may be the clearance 200, therebetween are fixed cover members fixed to a body, which may be the body frame 150, of the cabinet structure.

Accordingly, as described earlier in the embodiment, sound leakage can be suppressed while suppressing a temperature rise inside the cabinet by virtue of the complicatedly-shaped clearance deliberately left at the boundary between the fixed cover members.

According to aspect D, in the cabinet structure according to aspect A or B, at least one of the two cover members, which may be the second left-side cover 112 and the third left-side cover 113, that leave the clearance, which may be the clearance 200, therebetween is a hinged cover member operable to open and close.

Accordingly, as described earlier in the embodiment, even if the clearance is created at a portion operable to open and close, sound leakage can be reduced while reducing a temperature rise inside the cabinet by virtue of complicating the shape of the clearance.

According to aspect E, in the cabinet structure according to aspect D, both of the two cover members, which may be the second left-side cover 112 and the third left-side cover 113, that leave the clearance, which may be the clearance 200, therebetween are hinged cover members operable to open and close. The two hinged members are operable to open and close irrespective of which one of the hinged cover members is operated first.

Accordingly, as described earlier in the embodiment, the clearance can be provided without impairing the sound-leakage suppressing effect. Furthermore, configuring the two hinged members to be operable to open and close irrespective of which one of the hinged cover members is operated first prevents the structure configuration that creates the complicatedly-shaped clearance from adversely affecting usability.

According to aspect F, in the cabinet structure according to aspect D or E, the clearance, which may be the clearance 200, is sized to be greater than an excessively-pushed distance, which may be the excessively-pushed distance W, which is a travel of the hinged cover member, which may be the third left-side cover 113, from a position of the hinged cover member in a state where the hinged cover member has been closed to a farthest position to which the hinged cover member is movable when forcibly pushed by a closing action.

Accordingly, as described earlier in the embodiment, even if the hinged cover member is pushed by a closing action farther inside than the closed state where the hinged cover member has been closed, the hinged cover member is prevented from contacting the other cover member with which the clearance is created. Hence, a possible damage which would otherwise be caused by contact between the cover members that leave the clearance therebetween during an opening/closing operation can be avoided while maintaining the sound-leakage prevention effect provided by the complicated shape of the clearance.

According to aspect G, in the cabinet structure according to any one of aspects D to F, the clearance, which may be the clearance 200, is sized to permit fluctuations in component tolerances and clearances of movable units.

Accordingly, as described earlier in the embodiment, even in a condition of the component tolerances and the clearances of movable units that narrows the clearance most, heat can be dissipated through the clearance, so that sound leakage can be reduced while reducing a temperature rise inside the cabinet.

According to aspect H, in the cabinet structure according to any one of aspects A to C, the clearance, which may be the clearance 200, is sized to permit fluctuations in component tolerances.

Accordingly, as described earlier in the embodiment, even in a condition of the component tolerances that narrows the clearance most, heat can be dissipated through the clearance, so that sound leakage can be reduced while reducing a temperature rise inside the cabinet.

According to aspect I, in the cabinet structure according to any one of aspects A to H, the two cover members, which may be the second left-side cover 112 and the third left-side cover 113, that leave the clearance, which may be the clearance 200, therebetween are arranged in such a manner that a more-frequently-attached/detached one of the cover members is arranged on outer side.

Accordingly, as described earlier in the embodiment, even with the structure configuration that creates the complicatedly-shaped clearance at the boundary between the exterior-cover pieces adjacent to each other, serviceability can be maintained by reducing drop in efficiency in maintenance and replacement works.

According to aspect J, in the cabinet structure according to any one of aspects A to I, the two cover members, which may be the second left-side cover 112 and the third left-side cover 113, have tapered shapes, which may be the tapered shapes 500, at portions where the clearance is created.

Accordingly, as described earlier in the embodiment, assembling the cover members is facilitated.

According to aspect K, in the cabinet structure according to any one of aspects A to J, a protrusion, which may be the rib 113c, is arranged on a surface of at least one of the two cover members, which may be the second left-side cover 112 and the third left-side cover 113, that leave the clearance, which may be the clearance 200, therebetween at a portion at which surfaces of the cover members overlap with each other with the clearance therebetween. The protrusion is arranged to contact the surface of the other one of the cover members.

Accordingly, as described earlier in the embodiment, deformation of the clearance 200 is prevented, and a disadvantageous situation that the clearance is crushed into a sealed state or that the clearance is widened more than necessary is prevented. As a result, the size of the clearance can be maintained constant.

According to aspect L, in the cabinet structure according to any one of aspects A to K, length (L1 and L2, for example) of portions, at which the two cover members, which may be the second left-side cover 112 and the third left-side cover 113, that leave the clearance, which may be the clearance 200, therebetween overlap with each other with the clearance therebetween in directions along the passage is equal to or larger than 3.0 millimeters.

Accordingly, as described earlier in the embodiment, an undesirable situation that a portion of sound waves leaks to the outside without undergoing diffraction can be prevented because the portions at which the cover members that leave the clearance therebetween overlap with each other with the clearance therebetween has the length of such a certain value.

According to aspect M, electronic equipment, which may be the printer 100, including a sound source, which may be the drive devices and the optical writing unit 27, that emits sound when in operation and a cabinet, which may be the exterior-cover pieces, that covers the sound source uses the cabinet structure according to any one of aspects A to L as the cabinet.

Accordingly, as described earlier in the embodiment, leakage of sound emitted to the outside when the electronic equipment is in operation can be reduced while reducing a temperature rise in the cabinet when the electronic equipment is in operation.

According to aspect N, an electro-photographic image forming apparatus, which may be the printer 100, includes a structure of the electronic equipment according to aspect M.

Accordingly, as described earlier in the embodiment, leakage of sound emitted in image forming process can be reduced while reducing a temperature rise inside the apparatus in the image forming process.

According to an aspect of the present invention, a cabinet structure including multiple cover members can advantageously reduce sound leakage while reducing a temperature rise in the cabinet.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A cabinet structure comprising:
multiple cover members configured to spatially partition an inside from an outside of a cabinet, the multiple cover members including two cover members adjacent to each other and having a clearance therebetween, the clearance communicating between the inside and the outside of the cabinet, wherein
   a passage defined by the clearance and leading from the inside to the outside of the cabinet through the clearance has a shape with multiple bends, and
   a protrusion on a surface of at least one of the two cover members leaves the clearance therebetween at a portion at which surfaces of the cover members overlap with each other with the clearance therebetween, the protrusion contacting the surface of the other one of the cover members.

2. The cabinet structure according to claim 1, wherein the number of bends is three or more.

3. The cabinet structure according to claim 1, wherein both of the two cover members that leave the clearance therebetween are fixed cover members fixed to a body of the cabinet structure.

4. The cabinet structure according to claim 1, wherein at least one of the two cover members that leave the clearance therebetween is a hinged cover member operable to open and close.

5. The cabinet structure according to claim 4, wherein both of the two cover members that leave the clearance therebetween are hinged cover members operable to open and close, the two hinged cover members being operable to open and close irrespective of which one of the hinged cover members is operated first.

6. The cabinet structure according to claim 4, wherein the clearance is sized to be greater than an excessively-pushed distance, the excessively-pushed distance being a travel of the hinged cover member from a position of the hinged cover member in a closed state to a farthest position to which the hinged cover member is movable when forcibly pushed by a closing action.

7. The cabinet structure according to claim 4, wherein the clearance is sized to permit fluctuations in component tolerances and clearances of movable units.

8. The cabinet structure according to claim 1, wherein the clearance is sized to permit fluctuations in component tolerances.

9. The cabinet structure according to claim 1, wherein the two cover members that leave the clearance therebetween are arranged in such a manner that a more-frequently-attached/detached one of the cover members is on an outer side.

10. The cabinet structure according to claim 1, wherein the two cover members have tapered shapes at portions where the clearance is created.

11. The cabinet structure according to claim 1, wherein a length of portions, at which the two cover members that leave the clearance therebetween overlap with each other with the clearance therebetween, in directions along the passage is equal to or larger than 3.0 millimeters.

12. Electronic equipment comprising:
a sound source emitting sound in operation; and
a cabinet configured to cover the sound source,
wherein the cabinet structure according to claim 1 is used as the cabinet.

13. An image forming apparatus comprising:
a structure of the electronic equipment according to claim 12.

14. A cabinet structure comprising:
multiple cover members configured to spatially partition an inside from an outside of a cabinet, the multiple cover members including a first cover member and a second cover member adjacent to each other and having a clearance therebetween, the clearance communicating between the inside and the outside of the cabinet;
a first protrusion protruding into the inside of the cabinet from the first cover member;
a second protrusion protruding into the inside of the cabinet from the second cover member; and
a third protrusion protruding from at least one of a surface of the first protrusion and a surface of the second protrusion to come into contact with each other, at a portion which two surfaces that leave the clearance therebetween overlap with each other with the clearance therebetween, wherein
   the clearance is formed so that a tip of the first protrusion is surrounded by at least the second protrusion.

15. The cabinet structure according to claim 14, wherein a length of the portion in a direction along the first protrusion is equal to or larger than 3.0 millimeters.

16. Electronic equipment comprising:
a sound source emitting sound in operation; and
a cabinet configured to cover the sound source,
wherein the cabinet structure according to claim 14 is used as the cabinet.

17. An image forming apparatus comprising:
a structure of the electronic equipment according to claim 16.

* * * * *